(12) United States Patent
Shinto et al.

(10) Patent No.: US 8,120,248 B2
(45) Date of Patent: Feb. 21, 2012

(54) LIGHT-EMITTING DEVICE, ELECTRONIC APPARATUS, AND FILM-FORMING METHOD

(75) Inventors: Susumu Shinto, Chino (JP); Shinichi Yotsuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 103 days.

(21) Appl. No.: 12/326,493

(22) Filed: Dec. 2, 2008

(65) Prior Publication Data

US 2009/0146557 A1    Jun. 11, 2009

(30) Foreign Application Priority Data

Dec. 7, 2007    (JP) ................... 2007-316654

(51) Int. Cl.
*H01J 63/04*    (2006.01)

(52) U.S. Cl. ........................................ 313/506

(58) Field of Classification Search .......... 313/502–506, 313/498, 500, 507–509; 362/84
See application file for complete search history.

(56) References Cited

U.S. PATENT DOCUMENTS

2003/0197466 A1* 10/2003 Yamazaki et al. ............ 313/504
2005/0012445 A1* 1/2005 Yamazaki et al. ............ 313/500
2007/0170841 A1* 7/2007 Li ................................. 313/503

FOREIGN PATENT DOCUMENTS

| JP | A-2001-284041 | 10/2001 |
| JP | A-2007-103058 | 4/2007 |
| JP | A-2007-103098 | 4/2007 |

* cited by examiner

*Primary Examiner* — Karabi Guharay
*Assistant Examiner* — Brenitra Lee
(74) *Attorney, Agent, or Firm* — Oliff & Berridge, PLC

(57) ABSTRACT

A light-emitting device includes a substrate, and a light-emitting element including a lower electrode, a light-emitting function layer, and an upper electrode that are formed on the substrate in that order. At least one auxiliary electrode in a strip shape extends in a first direction on and in contact with the upper electrode. The auxiliary electrode has a cross section taken along the direction intersecting the first direction, having a shape including a tapered portion. The light-emitting device also includes a barrier layer covering the auxiliary electrode and the upper electrode. The barrier layer prevents water and oxygen from penetrating into the light-emitting element.

21 Claims, 8 Drawing Sheets

LIGHT-EMITTING DEVICE, ELECTRONIC APPARATUS, AND FILM-FORMING METHOD

BACKGROUND

1. Technical Field

The present invention relates to an electroluminescent light-emitting device and an electronic apparatus including the same, and a film-forming method suitably applied to the manufacturing processes of the device and apparatus.

2. Related Art

Among lightweight, thin light-emitting sources is an OLED (organic light emitting diode), that is, organic EL (electro luminescent) element. The organic EL element has a structure including at least one organic thin layer made of an organic material disposed between a pixel electrode and an opposing electrode. In this structure, the pixel electrode may act as an anode and the opposing electrode may act as a cathode. As a current is applied between these electrodes, the current flows through the organic thin layer, and thereby the organic thin layer, or the organic EL element, emits light. In this instance, the emission intensity depends on the magnitude of the current flowing through the organic thin layer. It is therefore necessary to pay due attention to control of the current, or potentials of the pixel electrode and the opposing electrode.

By arranging a large number of such organic EL elements and by appropriately controlling emission/non-emission of each organic EL element, images or the like representing a desired meaning can be displayed.

For example, Japanese Unexamined Patent Application Publication No. 2001-284041 discloses such an organic EL element and an image display apparatus including the organic EL elements.

The image display apparatus disclosed in this patent document has a known problem with current control and, in addition, a disadvantage in lifetime of the organic EL element. More specifically, the organic thin layer cannot emit light forever, of course, and it reaches the end of its lifetime after being used over a long term.

While such natural degradation is one of the problems with the lifetime of organic EL elements, the most critical problem is that some factors reduce the lifetime. A representative example of the factors is the presence of moisture and oxygen in the atmosphere. Undesirably, moisture and oxygen penetrate the organic thin layer to reduce the electroconductivity of the organic thin layer, or to degrade the adhesion between the organic thin layer and the electrodes.

In order to prevent these problems, thin film sealing is generally applied. In this technique, a ceramic thin layer superior in blocking oxygen and moisture is formed of, for example, silicon nitride to cover the organic EL element, thereby preventing oxygen and moisture from penetrating into the organic EL element.

However, the technique of thin film sealing has the following disadvantages. The ceramic sealing film is liable to crack because it is generally made of a relatively hard material, such as silicon nitride or silicon oxynitride. Once a crack occurs in the sealing film, moisture or oxygen comes into the organic EL element through the crack. Thus, the sealing film cannot function as intended.

The above-cited patent document discloses an application of the thin film sealing technique. In the patent document, an "inorganic passivation layer" is characterized as a layer having the function of blocking moisture (Paragraph [0017]). For reference sake, the cited patent document essentially discloses the following techniques (items inside parentheses refer to claim numbers or paragraph numbers in the patent document):

(i) Sealing films covering both sides of a partition member and protruding from a substrate (Claim 1) are formed between organic EL elements. (ii) The inorganic passivation layer is formed to cover the sealing films (Claim 1, and paragraphs [0015] and [0016]). (iii) Thus, the resulting inorganic passivation layer does not have steep slopes at both sides of the partition member, but easy slopes or smooth surfaces (paragraph [0021]). (iv) Although it is considered that the sides of the partition member, or the reverse-tapered portions at the sides of the partition member, easily transmit moisture and oxygen (paragraph [0021]), the inorganic passivation layer more appropriately block the moisture and oxygen because of the above (iii).

Although the cited document mentions "cracks" in, for example, paragraph [0016], it is not clearly shown whether the technique of the cited document is provided from the viewpoint described above.

In addition, the presence of the sealing film, which underlies the inorganic passivation layer, allows the inorganic passivation layer to be smooth in the cited document (see (ii) above). More specifically, the cited document focuses its feature on covering the reverse-tapered portions (FIG. 1 in the cited document) with the sealing film (FIG. 4 and paragraph [0022] in the cited document). Accordingly, the goal of the invention of the cited document is as described in (iv) above.

Therefore, the technique disclosed in the cited document may not sufficiently solve the above-described problems. To cover the reverse-tapered portions with the sealing film (or to cover the sides of the partition member with the sealing films, as stated in Claim 1) does not theoretically solve the problems.

Furthermore, the technique of the cited document essentially requires forming the sealing film as stated in Claim 1 of the cited document and as described above. This requires additional manufacturing steps and accordingly increases cost. From the viewpoint of achieving thin film sealing, however, only an inorganic passivation layer is essential.

SUMMARY

An advantage of some aspect of the invention is that it provides a light-emitting device including long-life organic EL elements and an electronic apparatus including the light-emitting device, and a film-forming method suitably applied to the manufacturing processes of the light-emitting device and the electronic apparatus, Another advantage is to solve some of the problems associated with the increase of the lifetime of organic EL elements.

According to an aspect of the invention, a light-emitting device is provided which includes a substrate, a light-emitting element including a lower electrode, a light-emitting function layer, and an upper electrode that are formed on the substrate in that order, and at least one auxiliary electrode in a strip shape extending in a first direction on and in contact with the upper electrode. The auxiliary electrode has a cross section taken along the direction intersecting the first direction, having a shape including a tapered portion. The auxiliary electrode and the upper electrode are covered with a barrier layer preventing at least one of water and oxygen from penetrating into the light-emitting element.

Consequently, the current flowing in the light-emitting function layer can be stably controlled. This is because the auxiliary electrodes (or strips of the auxiliary electrodes) are formed on and in contact with the upper electrode. If, for example, the upper electrode is formed (or must be formed) of a material having a relatively high resistance, the potential of the upper electrode can be stabilized by forming the auxiliary electrode of a material having a relatively low resistance. Thus, the current can be extremely stably controlled, so that the emission intensity of the light-emitting element can be appropriately controlled (this may be referred to as advantage (1)).

In addition, moisture or water and oxygen can be sufficiently blocked from penetrating into the light-emitting element. This is because the auxiliary electrode underlying the barrier layer is in a strip shape extending in the first direction and has a cross section including a tapered portion. Consequently, the barrier layer can be formed with a relatively smooth surface. Accordingly, a defect, such as a crack, does not easily occur at the surface or within the barrier layer. Therefore, the barrier layer can block water and oxygen extremely effectively even if the barrier layer is made of a relatively hard material (this may be referred to as advantage (2)).

Preferably, the auxiliary electrode has a larger thickness than the barrier layer.

Consequently, the above-describe advantages (1) and (2) can be produced more effectively. A larger thickness of the auxiliary electrode leads to a relatively larger cross section and, accordingly, leads to a reduced resistance. Consequently, the potential of the upper electrode can be more stably controlled.

In addition, since the thickness of the barrier layer becomes relatively small, cracks resulting from the internal stress of the barrier layer can be prevented. In particular, when the barrier layer is made of a relatively hard material, such a barrier layer is liable to be cracked. In a relatively thin barrier layer, however, such a risk can be reduced.

Thus, the above-describe advantages (1) and (2) can be produced more effectively.

The light-emitting device may further includes a power line disposed on the substrate and setting the upper electrode and the auxiliary electrode to a predetermined potential, and a contact thin film disposed between the upper electrode and auxiliary electrode and the power line and electrically connected to at least part of the upper electrode and auxiliary electrode and at least part of the power line. The contact thin film has a cross section taken along the first direction, having a shape including a tapered portion This structure can produce the above-describe advantages (1) and (2) more effectively. This is because the presence of the contact thin film allows smooth electrical circulation between the power line and the strip of the auxiliary electrode. If the contact thin film is not provided, the upper electrode or the auxiliary electrode is directly connected to the power line. In this instance, however, physical discontinuity may occur between the electrodes and the power line due to the difference between their thicknesses (in particular, the thicknesses of the upper electrode and the auxiliary electrode are smaller). In the structure described above, such a risk can be extremely reduced In addition, since the contact thin film also has a cross section including a tapered portion as with the auxiliary electrode, a defect, such as a crack, does not easily occur at the surface or within the barrier layer even though it is formed so as to cover the contact thin film.

Thus, the above-describe advantages (1) and (2) can be produced more effectively.

Preferably, the tapered portion of the cross section has an oblique side and a side adjacent to the oblique side that form an acute angle in the range of 20° to 60° therebetween.

In this instance, the cross section of the auxiliary electrode or the contact thin film can have a tapered portion in an optimal shape.

The reason why the angle is set in that range is as below. If the acute angle is more than 60°, the obtuse angle formed between the oblique side and the other side adjacent to the oblique side is reduced to be close to 90°. Consequently, the overlying barrier layer is formed so as to cover across a steep step. This easily causes a defect, such as a crack, at the surface or within the barrier layer. On the other hand, if the acute angle is less than 20°, the cross section of the auxiliary electrode is extremely reduced, and accordingly, it becomes difficult to reduce the resistance sufficiently.

The barrier layer may have a thickness in the range of 30 to 500 nm.

In this instance, the barrier layer has an optimal thickness.

The reason why the thickness is set in that range is as below. When the thickness of the barrier layer is more than 500 nm, the internal stress of the barrier layer may cause a crack in the barrier layer. In contrast, a barrier layer having a thickness of less than 30 nm cannot block moisture or water and oxygen.

According to another aspect of the invention, an electronic apparatus is provided which includes the light-emitting device described above.

Since the light-emitting device has the above-described advantages (1) and (2), the electronic apparatus including the light-emitting device is a long life. In addition, if the light-emitting device is used as an image display device, the electronic apparatus can display high-quality images.

According to still another aspect of the invention, a film-forming method is provided for forming a film using a thin film-forming mask including effective portions arranged at predetermined intervals. Each effective portion has a predetermined height and length and has a cross section including a trapezoidal shape. In the film-forming method, a substrate id disposed on the rear surface of the thin film-forming mask. A predetermined material is deposited on the surface of the substrate exposed in the gaps between the effective portions, thereby forming a number of thin films equal to the number of gaps. The thin films each have a cross section including a tapered shape.

Consequently, a plurality of thin films having tapered sections can be formed at one time in such a manner that strips of the thin films are arranged at appropriate intervals. How the thin films are formed will be described in the description of exemplary embodiments.

If the film-forming method is applied to the formation of the auxiliary electrodes, the strips of the electrodes can be favorably formed.

The material may be applied in a slanted direction onto the entirety of the surface of the substrate exposed in the gaps.

Thus, the thin films can be formed with a cross section including a favorable tapered shape.

In the film-forming method, a light-emitting element and a barrier layer may further be formed. The light-emitting element is formed on the substrate before the thin films are formed. The barrier layer prevents at least one of water and oxygen from penetrating into the light-emitting element and is formed after the thin films are formed. When the light-emitting element is formed, a lower electrode, a light-emitting function layer, and an upper electrode are formed. The thin films are formed as auxiliary electrodes on the surface of the upper electrode. The barrier layer is formed on the auxiliary electrodes.

Thus, a light-emitting device can be appropriately manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will now be described with reference to FIGS. 1 to 5. For the sake of convenience, the dimensional proportions of parts may differ as needed in these and other figures.

Figure 1:
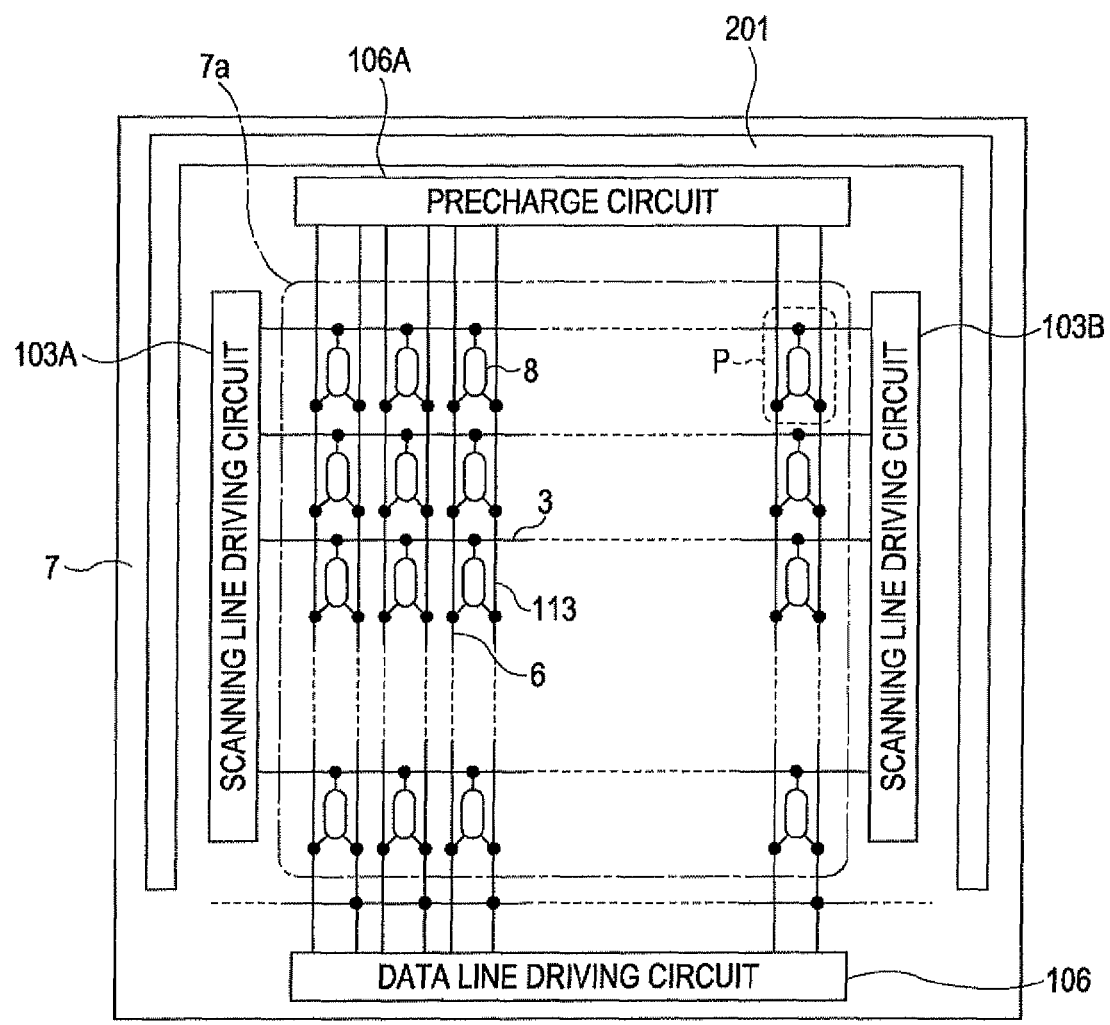
FIG. 1 is a plan view of a schematic structure of an organic EL device according to an embodiment of the invention.

FIG. 1 is a plan view of an organic EL device according to an embodiment of the embodiment.

The organic EL device shown in FIG. 1 includes an element substrate 7 and parts or members disposed on the element substrate 7. The parts or members include organic EL elements 8, scanning lines 3, data lines 6, scanning line driving circuits 103A and 103B, a data line driving circuit 106, a precharge circuit 106A, and an opposing electrode power line 201, The organic EL elements (light-emitting elements) 8 are arrayed in a matrix manner on the element substrate 7, as shown in FIG. 1. Each organic EL element 8 includes a pixel electrode, a light-emitting function layer, and an opposing electrode. The opposing electrode has an auxiliary electrode to support the function of the opposing electrode. These parts will be described later.

The organic EL elements 8 are disposed in an image display region 7a on the element substrate 7. The image display region 7a can display desired images by the organic EL elements 8 independently emitting or not emitting light. In the following description, the region of the surface of the element substrate 7 other than the image display region 7a refers to the outer region.

The scanning lines 3 and the data lines 6 are arranged corresponding to the rows and columns of the array of the organic EL elements 8. More specifically, the scanning lines 3 extend in the lateral direction of the figure, as shown in FIG. 1, and are connected to the scanning line driving circuits 103A and 103B disposed in the outer region. The data lines 6 extend in the vertical direction of the figure and are connected to the data line driving circuit 106 disposed in the outer region. The scanning line 3 and the data line 6 intersect with each other, and a unit circuit (pixel circuit) P including the organic EL element 8 is disposed in the vicinity of each intersection.

Figure 2:
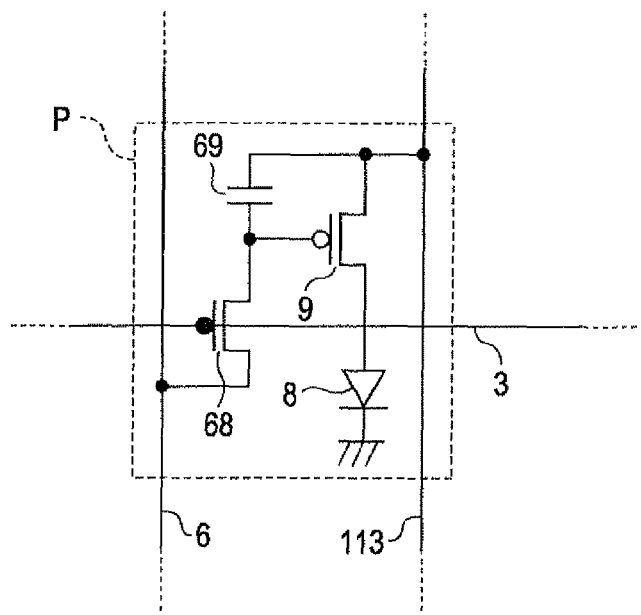
FIG. 2 is a circuit diagram of a unit circuit P shown in FIG. 1.

As shown in FIG. 2, the unit circuit P includes an n-type first transistor 68, a p-type second transistor 9, and a capacitor element 69 in addition to the organic EL element 8.

The unit circuit P receives electricity from a current supply line 113. A plurality of current supply lines 113 are connected to a power source (not shown).

The p-type second transistor 9 has a source electrode connected to the current supply line 113 and a drain electrode connected to the pixel electrode of the organic EL element 8. The capacitor element 69 is disposed between the source electrode and the gate electrode of the second transistor 9. The n-type first transistor 68 has a gate electrode connected to the scanning line 3, a source electrode connected to the data line 6, and a drain electrode connected to the gate electrode of the second transistor 9.

When the scanning line driving circuits 103A and 103B select a scanning line 3, each unit circuit P corresponding to the selected scanning line 3 turns on the first transistor 68 and holds a data signal transmitted through the data line 6 in the capacitor element 69. The second transistor 9 supplies a current according to the level of the data signal to the organic EL element 8. Thus, the organic EL element 8 emits light with a luminance according to the level of the data signal.

A precharge circuit 106A is disposed in the outer region on the element substrate 7. The precharge circuit 106A sets the data lines 6 at predetermined potentials before data signals are written in the organic EL elements 8.

The opposing electrode power line 201 (hereinafter simply referred to as power line 201) has an inverted U shape running substantially along the edges of the element substrate 7 when viewed from above. The power line 201 supplies a power voltage of, for example, a ground level to the opposing electrode of the organic EL element 8.

Although the scanning line driving circuits 103A and 103B, the data line driving circuit 106, and the precharge circuit 106A are all disposed on the element substrate 7 in the present embodiment, some or all of those circuits may be disposed on a flexible substrate. In such a case, an electrical terminal may be provided at a contact of the flexible substrate and the element substrate 7 to establish electrical contact between the substrates.

Figure 3:
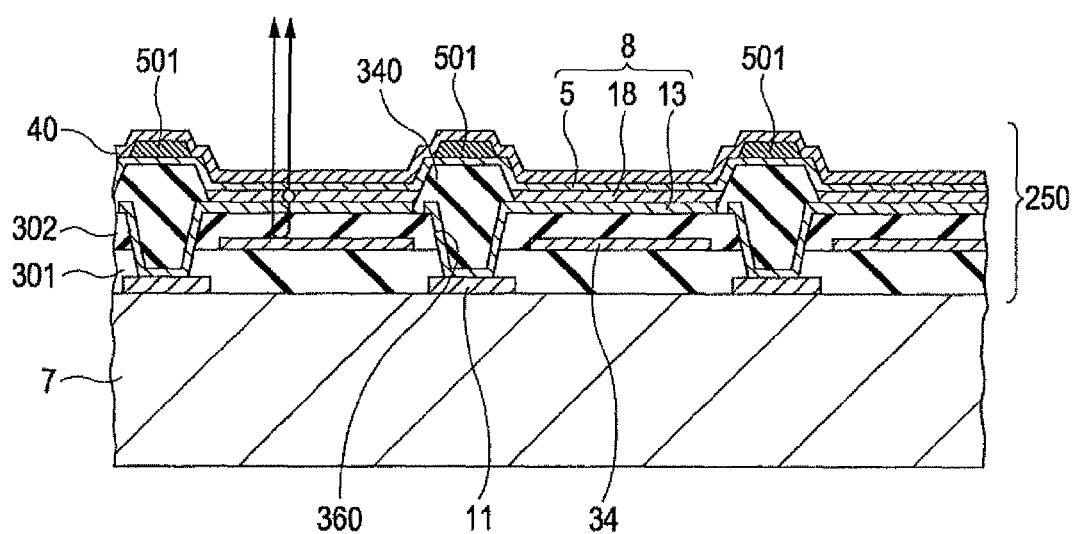
FIG. 3 is a sectional view of the organic EL device shown in FIG. 1, showing the structure of auxiliary electrodes and associated parts.

The organic EL device having such a structure in plan view includes a multilayer structure 250 as shown in FIG. 3. As shown in FIG. 3, the multilayer structure 250 includes circuit element thin films 11, a first insulating interlayer 301, a reflection layer 34, a second insulating interlayer 302, pixel electrodes 13, a light-emitting function layer 18, an opposing electrode 5, auxiliary electrodes 501, and a barrier layer 40 in that order from below on the element substrate 7.

The first and second insulating interlayers 301 and 302 prevent short circuits between other electroconductive parts, and ensure an appropriate arrangement of the electroconductive parts in the multilayer structure 250. Although the insulating interlayers 301 and 302 can be formed of various materials to various thicknesses, it is preferable that the material and the thickness be appropriately set according to the positions and functions of the insulating interlayers in the multilayer structure 250.

For example, the insulating interlayers 301 and 302 are preferably formed of $SiO_2$, SiN, SiON, or the like.

Each circuit element thin film 11 includes the first transistor 68 and the second transistor 9 of the unit circuit P. Simplified in FIG. 3, the circuit element thin film 11 includes a semiconductor layer including those transistors, a gate insulating layer, an electrode thin film including a gate metal and the capacitor element 69, and another metal layer (each not shown). The multilayer structure 250 shown in FIG. 3 of course includes the scanning lines 3 and the data lines 6, but these lines are not shown in the figure.

In the multilayer structure 250, the pixel electrode 13, the light-emitting function layer 18, and the opposing electrode 5 constitute the organic EL element 8, as shown in FIG. 3.

The pixel electrodes 13 are arranged in a matrix manner on the element substrate 7. The arrangement in a matrix manner of the pixel electrodes 13 corresponds to the arrangement in a matrix manner of the organic EL elements 8, as shown in FIGS. 1 and 3.

Each pixel electrode 13 is electrically connected to the corresponding circuit element thin film 11 through a contact hole 360. Thus, the pixel electrode 13 applies a current supplied from the current supply line 113 through the second transistor 9 shown in FIG. 2 to the light-emitting function layer 18. The contact hole 360 is formed so as to pass through the first and second insulating interlayers 301 and 302.

The pixel electrode 13 is made of an optically transparent electroconductive material, such as ITO (indium tin oxide).

The reflection layer 34 is patterned between the first insulating interlayer 301 and the second insulating interlayer 302, corresponding to the regions where the pixel electrodes 13 are disposed. The reflection layer 34 reflects light from the light-emitting function layer 18, as shown in FIG. 3. The reflected light runs upward. Thus, the organic EL device of the present embodiment is of a top emission type. Hence, the element substrate 7 may be made of an opaque material, such as ceramic or a metal (in contrast, the element substrate 7 of a bottom emission type organic EL device must be made of an optically transparent material).

Figure 4:
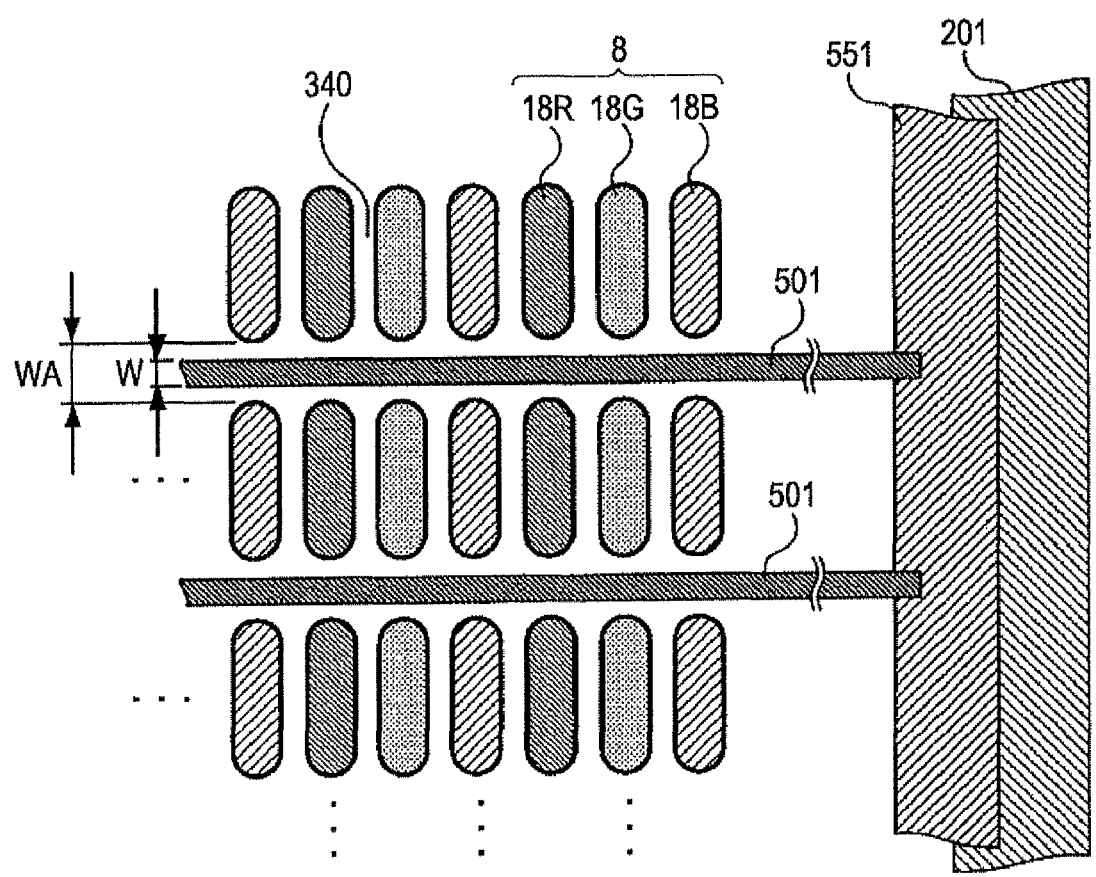
FIG. 4 is a fragmentary enlarged plan view of the organic EL device shown in FIG. 1, particularly showing the auxiliary electrodes and associated parts.

Preferably, the reflection layer 34 is made of a material having a relatively high reflectivity so that the reflection layer 34 can sufficiently reflect light. For example, the reflection layer can be made of a metal, such as aluminum or silver, As shown in FIGS. 3 and 4, a partition member (banks) 340 is formed so as to extend between any adjacent pixel electrodes 13. The partition member 340 has a height of about 1 to 2 µm. The partition member 340 separates the organic EL elements 8 from one another.

The partition member 340 is preferably made of, for example, an insulative transparent resin, and particularly a lyophobic resin. More specifically, the partition member 340 can be made of a fluorocarbon polymer, an acrylic resin, an epoxy resin, or polyimide.

If the partition member 340 is formed of such an organic resin, it is preferable that a base layer be formed of an inorganic material, such as $SiO_2$, under the organic resin layer so that the partition member 340 has a multilayer structure including an inorganic base layer and an organic layer. This structure increases the adhesion between the pixel electrodes 13 and the partition member 340 even though the pixel electrodes 13 are made of ITO or the like as above.

The light-emitting function layer 18 is formed on each pixel electrode 13, as shown in FIG. 3. The light-emitting function layer 18 includes an organic luminescent layer. The organic luminescent layer is made of an organic EL material in which holes and electrons are coupled to emit light. If an organic EL polymer is used as the organic EL material, the organic EL material can be applied only in spaces surrounded by the partition member 340 (for each pixel) by for example, a liquid ejection method (ink jet method).

By applying the organic EL material only in the spaces partitioned by the partition member 340, the light-emitting function layers 18 can be arranged so as to be distinguished by color as shown in FIG. 4. In FIG. 4, a red, a green, and a blue organic EL material are separately applied in that order in the transverse direction of the figure to form light-emitting function layers 18R, 18G, and 18B, respectively. Also, the same color light-emitting function layers are aligned in the vertical direction in such a manner that a line is constituted of red light-emitting function layers 18R G, another line is constituted of green light-emitting function layers 18G, and still another line is constituted of blue light-emitting layers 18B.

The light-emitting function layer 18 may further include some or all of an electron blocking layer, a hole injection layer, a hole transport layer, an electron transport layer, an electron injection layer, and a hole blocking layer.

The opposing electrode 5 is in contact with the light-emitting function layers 18 of the organic EL elements 8, as shown in FIG. 3. Hence, the opposing electrode 5 spreads over the partition member 340 and the light-emitting function layers 18 separated by the partition member 340 to act as a common electrode of the pixel electrodes 13. The opposing electrode 5 spreads in a plain rectangular shape (without openings or gaps). An outer side of the opposing electrode 5 is electrically connected to the power line 201 shown in FIG. 1 (the state of connection is not shown).

Although the opposing electrode 5 is a cathode and the pixel electrodes 13 are anodes in the present embodiment, their functions may be reversed.

The opposing electrode 5 is made of an optically transparent electroconductive material, such as ITO (Indium Tin Oxide). This is essential to top emission type organic EL devices.

The organic EL device of the present embodiment further includes auxiliary electrodes 501 and a barrier layer 40.

As shown in FIG. 3, the auxiliary electrodes 501 are formed on the portions of the opposing electrode 5 overlying the partition member 340. As is clear from FIG. 3, the auxiliary electrode 501 is directly formed on the opposing electrode 5; hence, it can be considered that the lower surface (the surface in contact with the opposing electrode 5) of the auxiliary electrode 501 is defined by contact points of the auxiliary electrode 501 with the upper surface of the opposing electrode 5. In other words, both electrodes establish substantially complete electrical continuity therebetween.

The auxiliary electrode 501 has a substantially rectangular shape in plan view, as shown in FIG. 4, and has a width extremely smaller than the length. Hence, the auxiliary electrode 501 is formed in a strip manner. A plurality of strips of the auxiliary electrodes 501 extend between the rows of the arrangement of the organic EL elements 8 running in the transverse direction of the figure, as shown in FIG. 4. One end of each auxiliary electrode 501 reaches a contact thin film 551, as shown in FIG. 4.

The contact thin film 551 is made of an electroconductive material and overlaps with the power line 201. The auxiliary electrodes 501 are formed in such a manner that each one end of the auxiliary electrodes 501 overlaps with the contact thin film 551.

The contact thin film 551 and the power line 201, and the contact thin film 551 and the auxiliary electrodes 501 establish substantially complete electrical continuity therebetween at their overlaps, as in the relationship between the opposing electrode 5 and the auxiliary electrodes 501. The opposing electrode 5 (not shown in FIG. 4) also overlaps with the contact thin film 551 to establish substantially complete electrical continuity therebetween (if the opposing electrode 5 is shown in FIG. 4, it covers the entirety of the figure).

Figure 5:
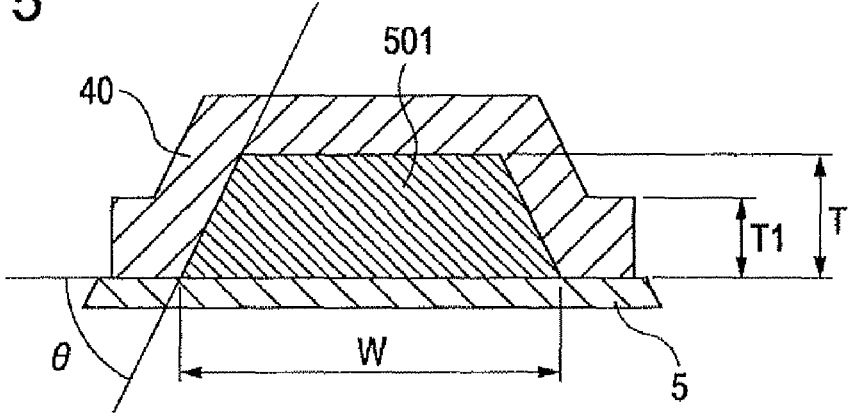
FIG. 5 is a sectional view of the auxiliary electrode.

The auxiliary electrode 501 has a tapered cross section as shown in FIGS. 3 and 5. The tapered section forms an angle θ in the range of 20° to 60° between the lower base and a tilted side adjacent to the lower base.

The barrier layer 40 is formed over the entire surface of the element substrate 7, thus covering the auxiliary electrodes 501 and the opposing electrode 5, as shown in FIGS. 3 and 5. The tapered cross sections of the auxiliary electrodes 501 allow the barrier layer 40 overlying the auxiliary electrodes 501 to have a relatively smooth surface. The barrier layer 40 blocks the penetration of moisture and oxygen into the organic EL elements 8.

Preferably, the auxiliary electrodes 501 are made of a material having a relatively low resistance, such as aluminum, silver, gold, or copper. These materials have extremely low electrical resistances of 2.62, 1.62, 2.4, and 1.69 μΩ/cm, respectively. Such a material can also be used for the contact thin film 551.

In the present embodiment, the auxiliary electrode 501 preferably has a shape specified by the following parameter values: a width W (see FIG. 4) of about 30 μm; and a thickness T (see FIG. 5) of about 300 nm. As is clear from FIG. 4, the width W depends on the distance WA between the organic EL elements 8 arranged in the vertical direction in the figure. While it is preferable that the width W be set after the distance WA is set, the distance WA may be set, for example, to about 50 nm for a width W of 30 nm (more specifically, it may be set so that the distances (=(WA−W)/2) from the sides of the auxiliary electrode 501 to the opposing ends of the organic EL elements 8 are each about 15 nm). The reason why the distance WA and the width W are set so as to be WA>W is that it is necessary to allow for a tolerance of the auxiliary electrodes 501 in the manufacturing process.

The specific values of the width W and the distance WA are associated with the above-described angle θ, and these dimensional parameters will be described later again with reference to FIG. 7.

Preferably, the barrier layer 40 is made of a material capable of blocking the penetration of water or moisture and oxygen into the organic EL elements 8, such as SiN (silicon nitride), SiON (silicon oxynitride), or $SiO_2$ (silicon oxide).

In the present embodiment, the barrier layer 40 preferably has a thickness T1 (see FIG. 5) in the range of 30 to 500 nm, and more preferably the thickness T1 is about 100 nm. A thickness T1 of more than 500 nm may result in the occurrence of cracks in the barrier layer 40 due to its own internal stress, and a thickness T1 of less than 30 nm may result in failure in blocking water or oxygen.

Advantages of the organic EL device having the above-describe structure will now be described.

In the organic EL device of the present embodiment, as a current is applied between the pixel electrode 13 and the opposing electrode 5, the current flows to the light-emitting function layer 18, and thereby the light-emitting function layer 18 emits light, as described with reference to FIG. 2.

The advantages described below are predicated on this.

(1) The organic EL device of the present embodiment can stably control the current flowing in the light-emitting function layer 18 because of the presence of the auxiliary electrodes 501.

More specifically, it is difficult to stabilize the potential of the opposing electrode 5 because the opposing electrode 5 is made of a material having a relatively high resistance, such as ITO. On the other hand, the auxiliary electrodes 501 are made of a material having a relatively low resistance, such as aluminum or silver. By applying a voltage from the power line 201 to the auxiliary electrodes 501 as well as to the opposing electrode 5, the potential of the opposing electrode 5 can be stabilized because of complete electrical continuity between the opposing electrode 5 and the auxiliary electrodes 501.

Thus, the current can be controlled extremely stably. Consequently, the emission intensity of the organic EL element 8 can be appropriately controlled.

The presence of the contact thin film 551 between the auxiliary electrodes 501 or the opposing electrode 5 and the power line 201 greatly contribute to producing such an advantage as well. Particularly for the top emission type as in the present embodiment, it is desired that the opposing electrode 5 have a thickness as small as possible from the viewpoint of increasing the efficiency in extracting light. However, excessive reduction of the thickness results in a physical breakage between the opposing electrode and the power line 201. The presence of the contact thin film 551 can prevent such discontinuity between the power line 201 and the opposing electrode S and similar problems.

(2) The organic EL device of the present embodiment can block the penetration of water or moisture and oxygen into the organic EL elements 8. This is because the auxiliary electrodes 501 underlying the barrier layer 40 have tapered cross sections that allow the barrier layer 40 to have a smooth surface, as described above. Accordingly, the barrier layer 40 does not easily crack at the surface or inside and, consequently, can block moisture and oxygen effectively.

This advantage can be produced more effectively by forming the contact thin film 551 so as to have a tapered cross section (for example, taken in the direction in which the auxiliary electrodes 501 extend). In such a structure, the surface of the barrier layer 40 can be smooth even at the portion covering across the contact thin film 551 and the region where the contact thin film 551 is not formed.

Figure 6:
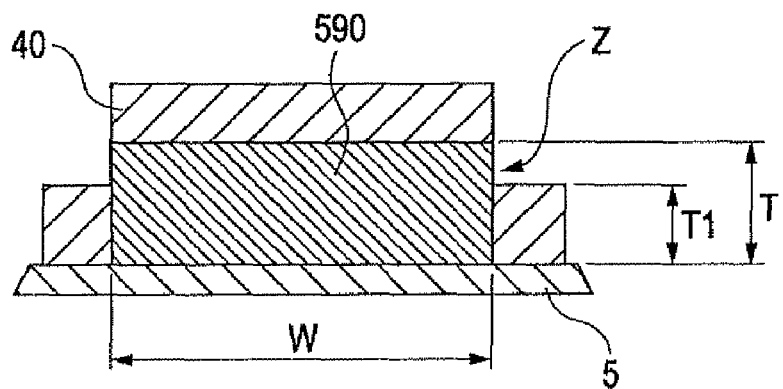
FIG. 6 is a sectional view of an auxiliary electrode comparative to that shown in FIG. 5.
Figure 7:
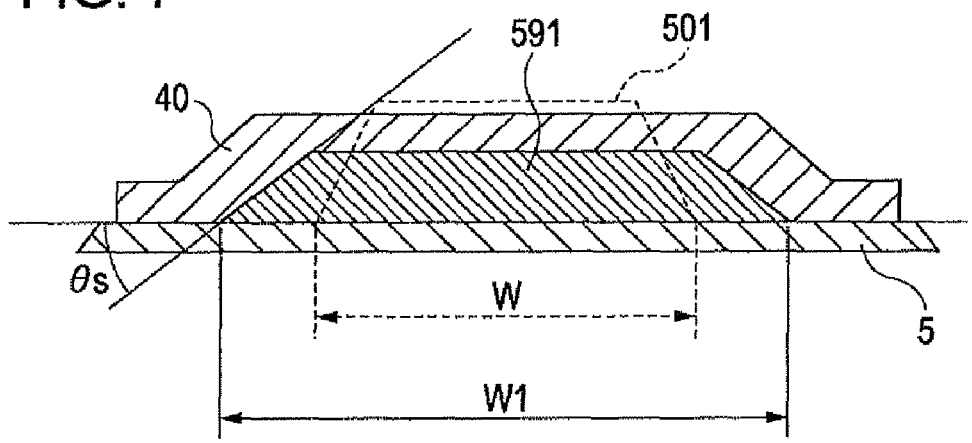
FIG. 7 is a sectional view of an auxiliary electrode comparative to that shown in FIG. 5.

The above described advantages will be clearer from comparison with other auxiliary electrodes shown in FIGS. 6 and 7.

The auxiliary electrode 590 shown in FIG. 6 has a completely rectangular cross section. If, in this instance, the barrier layer 40 is formed so as to cover the auxiliary electrode 590, a discontinuous portion z can be produced at the vicinity of the edge of the auxiliary electrode 50 with a high probability.

On the other hand, the barrier layer 40 of the present embodiment is formed so as to cover the obtuse angles of the tapered cross section, and consequently, the surface of the barrier layer 40 can be smooth.

The phenomenon as shown in FIG. 6 easily occurs when the auxiliary electrode 590 has a larger thickness than the barrier layer 40 (that is, when T>T1 holds). However, advantages (1) and (2) are produced more effectively when this relationship holds. More specifically, as the thickness of the auxiliary electrode is increased, its resistance is reduced and, accordingly, the current of the light-emitting function layer 18 can be more stably controlled. Also, as the thickness of the barrier layer 40 is reduced, the barrier layer 40 can block moisture and oxygen more reliably because cracks resulting from its own internal stress (theoretically different from cracks resulting from the step coverage as described above) can be prevented.

Therefore, the auxiliary electrode 590 having a rectangular cross section as shown in FIG. 6 is obviously disadvantageous.

On the other hand, the auxiliary electrode 501 having the tapered cross section of the embodiment can have a larger thickness than the barrier layer 40 because there is no risk of causing the discontinuous portion Z as shown in FIG. 6 (in FIGS. 5 and 6, the auxiliary electrodes 501 and 590 have the same thickness T and the barrier layers 40 have the same thickness T1). Consequently, the above-describe advantages can be produced.

The embodiment can therefore produce both advantages (1) and (2).

Accordingly, an upper limit should be set for the angle $\theta$ shown in FIG. 5. Preferably, the upper limit of the angle $\theta$ is 60° as mentioned above.

FIG. 7 shows another auxiliary electrode 591 having a tapered cross section whose angle $\theta s$ is smaller than the angle $\theta$ shown in FIG. 5. There is no difference in principle between the structures shown in FIGS. 5 and 7 in view of advantages (1) and (2). Indeed, the structure shown in FIG. 7 can be more effective than the structure shown in FIG. 5 from the viewpoint of producing advantage (2).

However, it can affect the acquisition of advantage (1). If the angle $\theta$ of auxiliary electrode is reduced to $\theta s$ as shown in FIG. 7 while the width W of the auxiliary electrode is kept W, the area of the cross section is obviously reduced and accordingly the resistance is increased. Consequently, the stability of the potential of the opposing electrode 5, associated with advantage (1), is adversely affected.

In order to maintain the area of the cross section with the angle $\theta s$ (<$\theta$), the width W of the auxiliary electrode is increased to W1 as shown in FIG. 7. This undesirably produces another problem. The distance WA shown in FIG. 4 is increased in association with the increase of the width of the auxiliary electrode. Consequently, the intervals between the organic EL elements 8 may be increased to reduce the aperture ratio or to degrade the definition of images.

Thus, it is not necessarily preferable that the angle $\theta$ be small.

In short, although it is preferable that the angle $\theta$ be reduced as much as possible from the viewpoint of producing advantage (2), the reduction of the angle $\theta$ should be limited to some extent from the viewpoint of producing advantage (1) and preventing problems resulting from the reduction of the angel $\theta$. Preferably, the lower limit of the angle $\theta$ is 20° as mentioned above.

The above-described two advantages may be produced most effectively in, for example, the following two cases. These cases provide optimal embodiments of the invention.

Case 1
Auxiliary electrode width W=30 μm
Auxiliary electrode thickness T=310 nm
Tapered cross section angle $\theta$=45°
Auxiliary electrode material=aluminum
Barrier layer thickness T=200 nm
Barrier layer material=SiON
Case 2
Auxiliary electrode width W=30 μm
Auxiliary electrode thickness T=200 nm
Tapered cross section angle $\theta$=30°
Auxiliary electrode material=silver
Barrier layer thickness T1=200 nm
Barrier layer material=SiON In the above cases, the auxiliary electrode of case 2 can have a smaller thickness than that of case 1 because silver has a lower resistance than aluminum. Also, the angle $\theta$ in case 2 can be smaller than that in case 1 because of the same reason.

In either case, it has been confirmed that the structure having the parameters of case 1 or 2 can produce the advantages of the embodiment most effectively.

A method for manufacturing the above-described organic EL device, particularly forming the auxiliary electrode 501, will now be described.

Thin Film-forming Mask Used in the Film Forming Fethod of the Embodiment

A thin film-forming mask used in a film-forming method according to an embodiment of the invention will first be described with reference to FIGS. 8 and 9.

Figure 8:
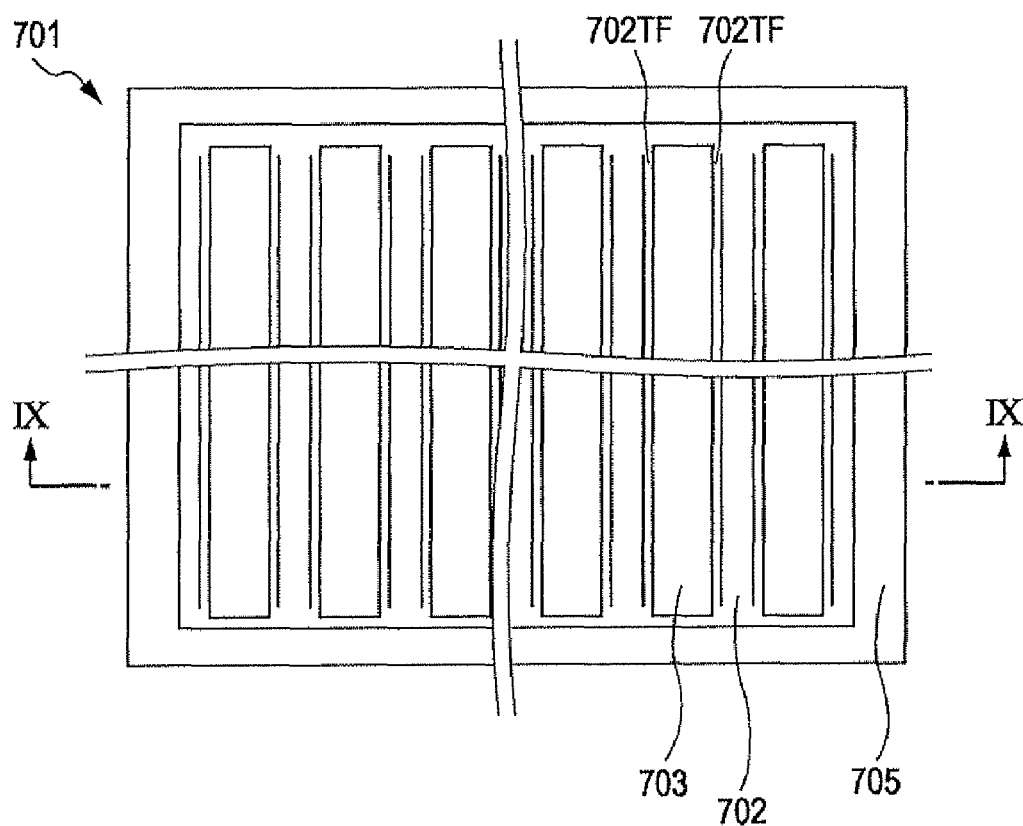
FIG. 8 is a plan view of a mask used for forming auxiliary electrodes according to an embodiment of the present invention.
Figure 9:
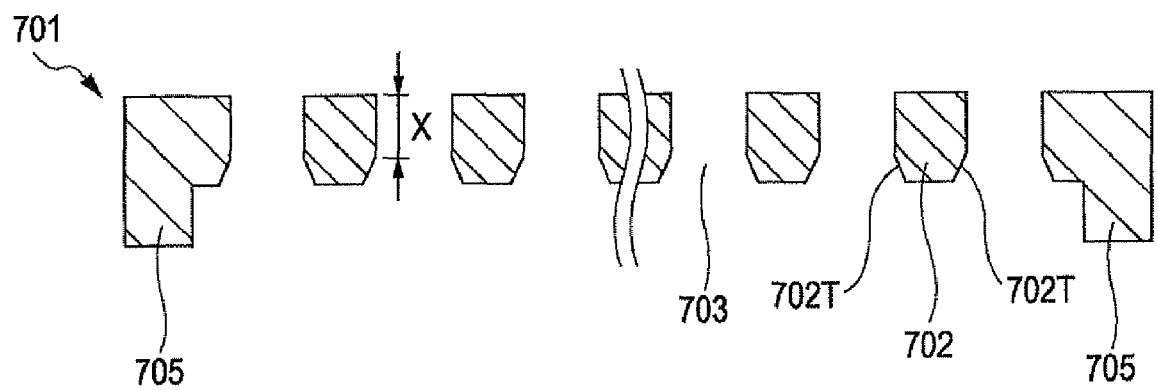
FIG. 9 is a sectional view of the auxiliary electrode shown in FIG. 8 taken along line IX-IX.

The thin film-forming mask 701 (hereinafter simply referred to as the mask 701) includes a plurality of effective portions 702 having a predetermined height and length whose cross section includes a trapezoidal portion, as shown in FIGS. 8 and 9.

More strictly, the mask further includes a frame 705 in addition to the effective portions 702.

The frame 705 has a shape like a picture frame, as shown in FIG. 8. The size of the entire mask 701 can be appropriately set according to the size of the substrate on which thin films to be formed using the mask 701.

The effective portions 702 each extend so as to communicate between the upper side and the lower side of the frame 705, as shown in FIG. 8. More specifically, each effective portion 702 has a length substantially equal to the length of a side of the rectangular region surrounded by the frame 705. A plurality of effective portions 702 having such a length are arranged in the transverse direction of the figure, as shown in FIG. 8. Hence, any two adjacent effective portions are separated by a gap 703.

The effective portion 702 has a cross section in a shape formed by coupling a rectangular shape having a height of X and a trapezoidal shape having a base doubles as a side of the rectangular shape, as shown in FIG. 9. As shown in FIG. 9, the trapezoidal shape has two oblique sides 702T. The oblique sides 202T of the cross section represent the oblique faces of the effective portion 702, and the oblique faces extend over the length of the effective portion 702, as shown in FIG. 8.

Figure 10:
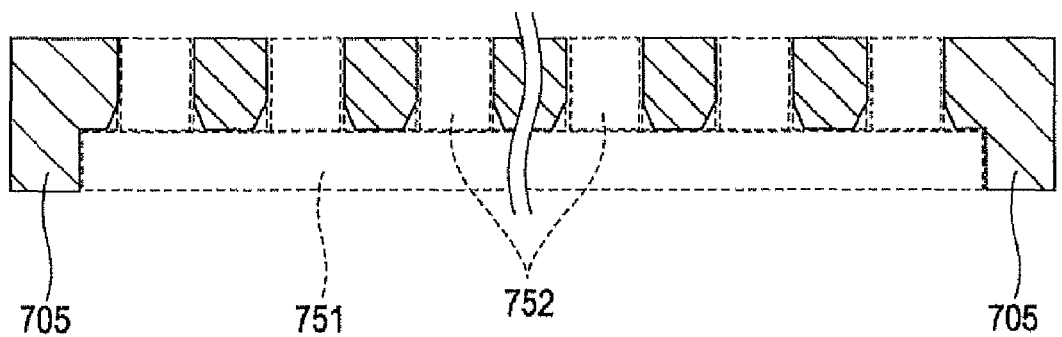
FIG. 10 is a sectional view showing a preparation of the mask shown in FIG. 8.
Figure 11:
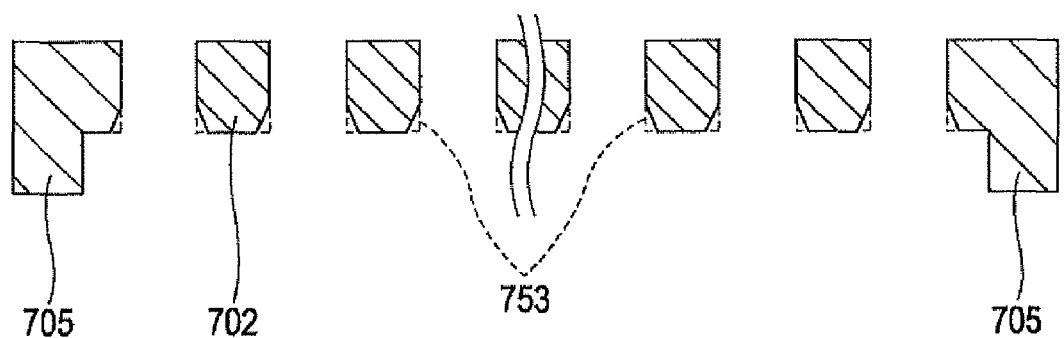
FIG. 11 is a sectional view showing the preparation of the mask shown in FIG. 8.

Such a mask 701 can be formed, for example, as shown in FIGS. 10 and 11. In these figures, the mask 701 is formed of a mother material of a (110) silicon single crystal. First, the mother material is etched to remove a portion 751 shown in FIG. 10 to form a rough shape of the frame 705. Subsequently, second etching is performed to remove portions 752 of the mother material to form a rough pattern of the effective portions 702 with gaps 703.

Finally, the rough pattern of the effective portions 702 is etched by third etching as shown in FIG. 11. The third etching is anisotropic etching. For a wet etching, a mixture containing, for example, KOH, isopropyl alcohol, and water is preferably used as the etchant. Anisotropic etching removes only the edges of the rough pattern (leaves hatched portions in FIG. 11) and finally forms effective portions 702 as shown in FIG. 9.

The film-forming method can be performed according to an embodiment described below, using the above-described thin film-forming mask.

Steps Up to Forming the Auxiliary Electrodes 501:

First, circuit element thin films 11, an insulating interlayers 301 and 302, a reflection layer 34, pixel electrodes 13, a light-emitting function layer 18, a partition member 340, and an opposing electrode 5 are formed on an element substrate 7, as shown in FIG. 3.

The insulating interlayers 301 and 302 and the pixel electrodes 13 are formed by an appropriate known method, such as CVD (chemical vapor deposition), sputtering, or photolithography. In the formation of the circuit element thin films 11, their semiconductor layer is doped to form thin film transistors (TFTS), such as first transistors 68. In the formation of the pixel electrodes 13, appropriate etching is performed to form contact holes 360 in the insulating interlayers 301 and 302.

In order to form the partition member 340, for example, photosensitive polyimide is applied to form a coating, and the photosensitive polyimide coating is subjected to exposure and development to form a plain partition member. The surface of the plain partition member is subjected to atmospheric pressure plasma treatment. The atmospheric pressure plasma treatment is intended to give the surface of the partition member 340 a lyophobicity or an ink-repellency.

The light-emitting function layer 18 may be formed of a low-molecular-weight material by a known film-forming method as mentioned above, or may be formed of a polymer by an ink jet method or other liquid ejection methods. If the surface of the partition member 340 is lyophobic or ink-repellent in this step, an ink containing an active constituent can be reliably deposited in the regions surrounded by the partition member 340.

Figure 12:
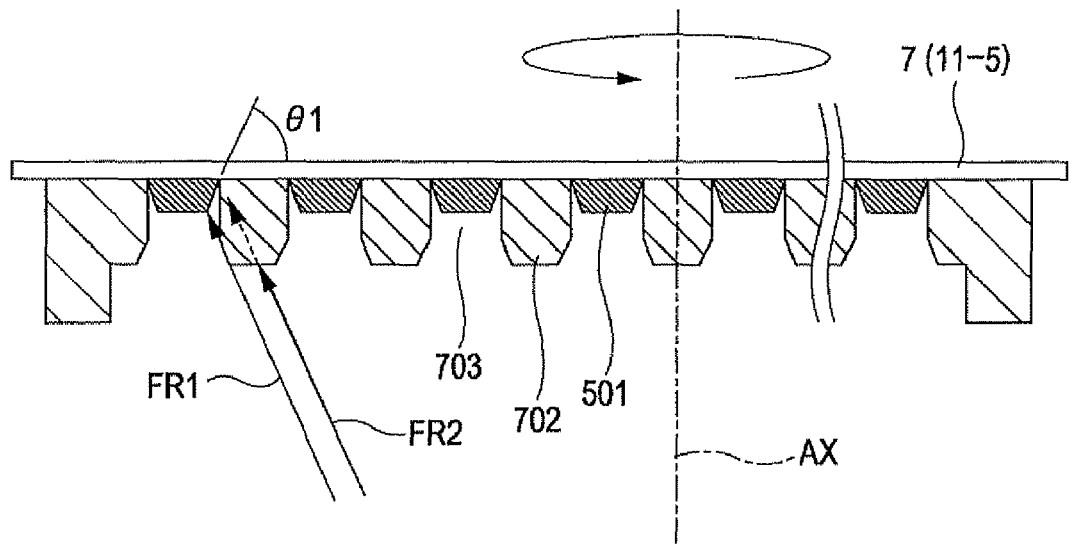
FIG. 12 is a representation of a step forming the auxiliary electrodes using the mask shown in FIG. 8.
Figure 13:
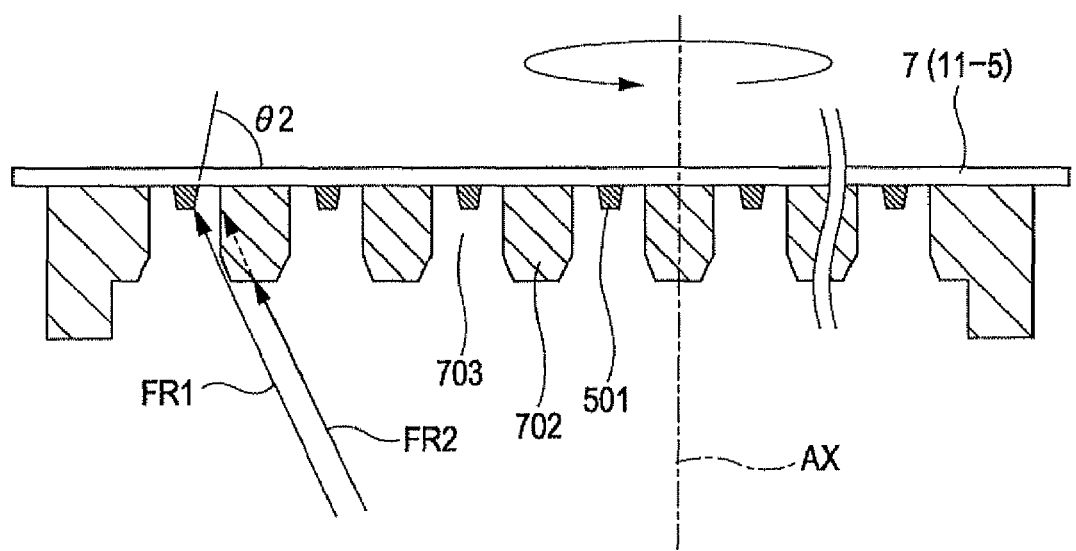
FIG. 13 is a representation of a step forming the auxiliary electrodes using the mask shown in FIG. 8.

Forming Auxiliary Electrodes 501:

Subsequently, auxiliary electrodes 501 are formed on the element substrate 7 on which the steps up to forming the opposing electrode 5 have been performed, as shown in FIG. 12. For the sake of simplicity, the element substrate 7 on which the steps up to forming the opposing electrode 5 have been performed will be simply referred to as the element substrate 7 (11-5) in the following description. The numerals (11-5) means that parts from the circuit element thin films 11 to the opposing electrode 5 have been formed on the element substrate 7. For the sake of simple representation, FIG. 12 shows the element substrate 7 (11-5) in a simple rectangular shape, and the same applies to following FIG. 13.

First, the mask 701 is prepared and the element substrate 7 (11-5) is disposed on the rear surface (upper surface in FIG. 12) of the mask 701. In this instance, the element substrate 7 (11-5) is disposed such that the partition member 340 corresponds to the gaps 703 of the mask, as is clear from FIGS. 3, 4, and 5. In this step, it is clearly understood that the width WA shown in FIG. 4 should be set larger than the width W shown in the same figure.

As a result of the steps up to above, the surface of the opposing electrode 5 covering the tops of the partition member 340 is exposed in the gaps 703.

Then, the combination of the mask 701 and the element substrate 7(11-5) is enclosed in an appropriate chamber, and is rotated on an axis AX passing across the combination at a predetermined temperature.

Subsequently, a film-forming process is performed on the rotating combination through the mask 701. The film-forming process may be performed by sputtering or physical vapor deposition (PVD) in which the raw material is heated in a crucible or with a laser. Thus, a predetermined material (preferably, aluminum, silver, or the like, as described above) is deposited on the portions of the element substrate 7 (11-5) exposed in the gaps 703.

In this instance, the material is applied, for example, through routes as indicated by the arrows FR1 and FR2 shown in FIG. 12. The material applied through the route FR1 reaches the surface of the element substrate 7 (11-5) exposed in the gaps. Since the route FR1 glances off the oblique side 702T (or oblique faces 702TF) of the effective portion 702, as shown in FIG. 12, the route FR1 means a limit of the routes through which the material can reach into the gap 703. More specifically, the material reaching the mask 701 through routes (for example, route FR2) to the right of the route FR1 in the figure is blocked by the effective portion 702 and cannot reach into the gap 703 (as indicated by a dashed arrow in the figure).

Thus, and from FIG. 12, the material is not deposited in regions of the shadow of the effective portion 402.

Consequently, a number of auxiliary electrodes 501 equal to the number of gaps 703 are formed in thin films having cross sections including tapered shapes, as shown in FIG. 12.

The film-forming method of the present embodiment features adjusting the height X shown in FIG. 9 to adjust the angle θ or the width W of the tapered cross section shown in FIG. 5. More specifically, a height X larger than that in FIG. 12 leads to an auxiliary electrode 501 having a cross section having a smaller width W and a larger angle θ (θ2 (FIG. 13)>θ1 (FIG. 12)).

Thus, the film-forming method of the embodiment can appropriately form the auxiliary electrodes 501 having tapered cross sections at one time in such a manner that a plurality of strips of the electrodes are arranged at appropriate intervals.

In the film-forming method, where the material source (for example, a crucible or evaporation source for vapor deposition by heating the crucible) of the film is placed is not particularly limited. It is however preferably that the material source be located in a place from which the material can be applied in a slanted direction onto the surface of the substrate 7 (11-5) exposed in the gaps 703, from the viewpoint of forming a shape having a tapered cross section. However, if the direction of the material is excessively slanted, almost all the material ejected is blocked by the effective portions 702, and accordingly the film forming efficiency is considerably reduced. If the height x is excessively increased, the same occurs (as is clear from the comparison of the sizes between the auxiliary electrodes 501 shown in FIGS. 12 and 13).

Applications

Figure 14:
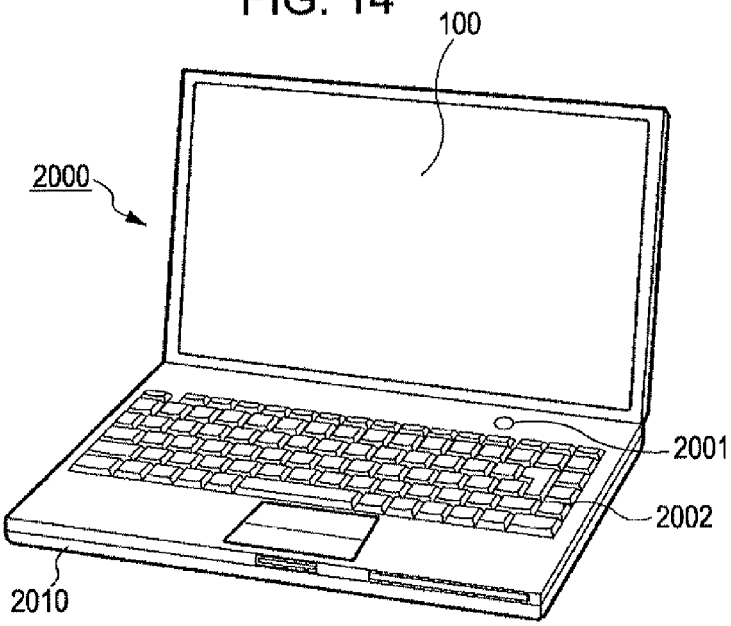
FIG. 14 is a perspective view of an electronic apparatus including an organic EL device according to an embodiment of the invention.

Electronic apparatuses including an organic EL device according to an embodiment of the invention will now be described. FIG. 14 is a perspective view of a mobile personal computer including an image display device to which the organic EL device of the above-describe embodiment is applied. The personal computer 2000 includes an organic EL device 100 as a display device and a body 2010. The body 2010 includes a power switch 2001 and a key board 2002.

Figure 15:
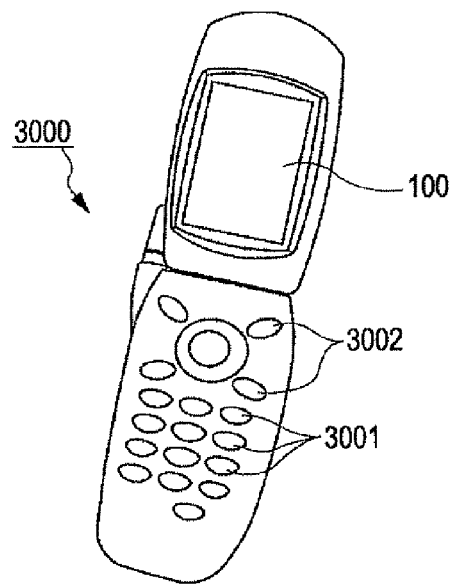
FIG. 15 is a perspective view of another electronic apparatus including an organic EL device according to an embodiment of the invention.

FIG. 15 shows a cellular phone including the organic EL device of the above-described embodiment The cellular phone 3000 includes a plurality of control buttons 3001 and scroll buttons 3002 and an organic EL device 100 as a display device. By operating the scroll buttons 3002, images displayed on the organic EL device 100 is scrolled.

Figure 16:
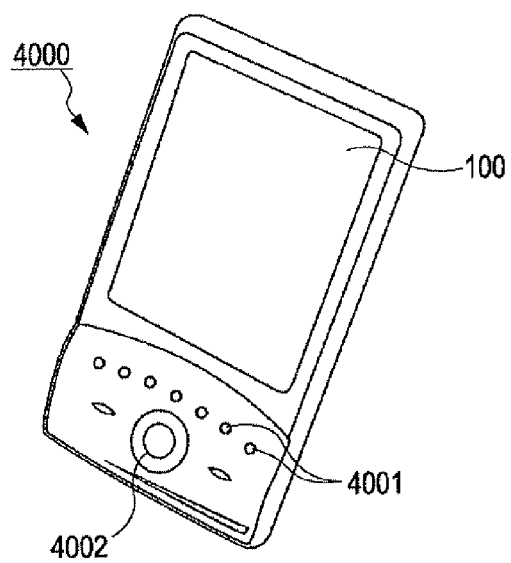
FIG. 16 is a perspective view of still another electronic apparatus including an organic EL device according to an embodiment of the invention.

FIG. 16 shows a personal digital assistant (PDA) including the organic EL device of the above-described embodiment.

The PDA 4000 includes a plurality of control buttons 4001, a power switch 4002, and an organic EL device 100 as a display device. On pressing the power switch 4002, various types of information, such as addresses and schedules, are displayed on the organic EL device.

In addition to the apparatuses shown in FIGS. 14 to 16, the organic EL device can be used in other electronic apparatuses including digital still cameras, TV sets, video cameras, car navigation systems, pagers, electronic notebooks, electronic papers, electronic calculators, word processors, work stations, videophones, POS terminals, video players, and other touch panel-equipped apparatuses.

What is claimed is:

1. A light-emitting device comprising:
   a substrate;
   a light-emitting element including a lower electrode, a light-emitting function layer, and an upper electrode that are formed on the substrate in that order;
   at least one auxiliary electrode in a strip shape extending in a first direction, disposed upon and in contact with the upper electrode, the auxiliary electrode having a cross section taken along the direction intersecting the first direction, the cross section having a shape including a tapered portion;
   a barrier layer covering the auxiliary electrode and the upper electrode, the barrier layer preventing at least one of water and oxygen from penetrating into the light-emitting element;
   a power line disposed on the substrate and setting the upper electrode and the auxiliary electrode to a predetermined potential; and
   a contact thin film disposed between 1) the upper electrode and auxiliary electrode, collectively and 2) the power line, the contact thin film being electrically connected to at least part of the upper electrode, the auxiliary electrode, and at least part of the power line, the contact thin film having a cross section taken along the first direction, and the contact thin film having a shape including a tapered portion,
   wherein the tapered portion of the cross section has an oblique side and a side adjacent to the oblique side that form an acute angle that is greater than 20° and less than 60°.

2. The light-emitting device according to claim 1, wherein the auxiliary electrode has a larger thickness than the barrier layer.

3. A light-emitting device comprising:
   a substrate;
   a light-emitting element including a lower electrode, a light-emitting function layer, and an upper electrode that are formed on the substrate in that order;
   at least one auxiliary electrode in a strip shape extending in a first direction, disposed upon and in contact with the upper electrode, the auxiliary electrode having a cross section taken along the direction intersecting the first direction, the cross section having a shape including a tapered portion;
   a barrier layer covering the auxiliary electrode and the upper electrode, the barrier layer preventing at least one of water and oxygen from penetrating into the light-emitting element;
   a power line disposed on the substrate and setting the upper electrode and the auxiliary electrode to a predetermined potential; and
   a contact thin film disposed between 1) the upper electrode and auxiliary electrode, collectively and 2) the power line, the contact thin film being electrically connected to at least part of the upper electrode, the auxiliary electrode, and at least part of the power line, the contact thin film having a cross section taken along the first direction, and the contact thin film having a shape including a tapered portion,
   wherein the tapered portion of the cross section has an oblique side and a side adjacent to the oblique side that form an acute angle in the range of 20° to 60° therebetween.

4. The light-emitting device according to claim 1, wherein the barrier layer has a thickness in the range of 30 to 500 nm.

5. An electronic apparatus comprising the light-emitting device as set forth in claim 1.

6. The light-emitting device according to claim 1, wherein a thickness of the auxiliary electrode is less than a width of the auxiliary electrode.

7. The light-emitting device according to claim 1, wherein a thickness of the auxiliary electrode is approximately 300 nm.

8. The light-emitting device according to claim 1, wherein a width of the auxiliary electrode is approximately 30 μm.

9. The light-emitting device according to claim 1, wherein a width of the auxiliary electrode is smaller that a length of the auxiliary electrode.

10. The light-emitting device according to claim 1, where in distance from a side of the auxiliary electrode to an opposing end of the light-emitting element is approximately 10 to 15 nm.

11. The light-emitting device according to claim 1, wherein a width of the auxiliary electrode is less than a distance between opposing ends of a plurality of light-emitting elements.

12. The light-emitting device according to claim 1, wherein a distance between opposing ends of a plurality of light-emitting elements is approximately 50 nm.

13. The light-emitting device according to claim 1, wherein the barrier layer has a thickness of approximately 100 nm.

14. The light-emitting device according to claim 1, wherein the tapered portion of the cross section has an oblique side and a side adjacent to the oblique side that form an acute angle that is approximately 30°.

15. The light-emitting device according to claim 1, wherein the tapered portion of the cross section has an oblique side and a side adjacent to the oblique side that form an acute angle that is approximately 45°.

16. The light-emitting device according to claim 1, wherein the tapered portion of the cross section has an oblique side and a side adjacent to the oblique side that form an acute angle that is 30°.

17. The light-emitting device according to claim 1, wherein the tapered portion of the cross section has an oblique side and a side adjacent to the oblique side that form an acute angle that is 45°.

18. The light-emitting device according to claim 3, wherein the tapered portion of the cross section has an oblique side and a side adjacent to the oblique side that form an acute angle that is approximately 30°.

19. The light-emitting device according to claim 3, wherein the tapered portion of the cross section has an oblique side and a side adjacent to the oblique side that form an acute angle that is approximately 45°.

20. The light-emitting device according to claim 3, wherein the tapered portion of the cross section has an oblique side and a side adjacent to the oblique side that form an acute angle that is 30°.

21. The light-emitting device according to claim 3, wherein the tapered portion of the cross section has an oblique side and a side adjacent to the oblique side that form an acute angle that is 45°.

* * * * *